(12) United States Patent
Zhu et al.

(10) Patent No.: US 9,275,941 B2
(45) Date of Patent: Mar. 1, 2016

(54) QUAD FLAT NO LEAD PACKAGE AND PRODUCTION METHOD THEREOF

(75) Inventors: Wenhui Zhu, Tianshui (CN); Wei Mu, Tianshui (CN); Zhaoming Xu, Tianshui (CN); Xiaowei Guo, Tianshui (CN)

(73) Assignees: TIANSHUI HUATIAN TECHNOLOGY CO., Tianshui (CN); HUATIAN TECHNOLOGY (XI'AN) CO., LTD., Xi'an (CN)

( * ) Notice: Subject to any disclaimer, the term of this patent is extended or adjusted under 35 U.S.C. 154(b) by 0 days.

(21) Appl. No.: 14/367,788

(22) PCT Filed: Aug. 31, 2012

(86) PCT No.: PCT/CN2012/080858
§ 371 (c)(1),
(2), (4) Date: Jun. 20, 2014

(87) PCT Pub. No.: WO2013/149451
PCT Pub. Date: Oct. 10, 2013

(65) Prior Publication Data
US 2015/0102476 A1   Apr. 16, 2015

(30) Foreign Application Priority Data
Apr. 6, 2012  (CN) .......................... 2012 1 0098828

(51) Int. Cl.
*H01L 21/00*  (2006.01)
*H01L 23/495*  (2006.01)
(Continued)

(52) U.S. Cl.
CPC ...... *H01L 23/49524* (2013.01); *H01L 21/4832* (2013.01); *H01L 23/3107* (2013.01);
(Continued)

(58) Field of Classification Search
CPC ..... H01L 24/49; H01L 24/29; H01L 23/3107; H01L 23/49524; H01L 23/49541; H01L 21/4832; H01L 23/49579; H01L 24/03; H01L 24/45
See application file for complete search history.

(56) References Cited

U.S. PATENT DOCUMENTS

2012/0061808 A1   3/2012  Liao
2012/0119342 A1*  5/2012  Chang Chien et al. ....... 257/676

FOREIGN PATENT DOCUMENTS

CN   102339809   2/2011
CN   102130073   7/2011
(Continued)

*Primary Examiner* — Richard Booth
(74) *Attorney, Agent, or Firm* — Hamre, Schumann, Mueller & Larson, P.C.

(57) ABSTRACT

The present invention discloses a quad flat no lead package and a production method thereof. The quad flat no lead package comprises a lead frame carrier consisting of a carrier pit and three circles of leads arranged around the carrier pit, wherein the three circles of leads respectively consist of a plurality of leads that are disconnected mutually; an IC chip is adhered in the carrier pit; and an inner lead chemical nickel and porpezite plated layer is plated on all the leads; the inner lead chemical nickel and porpezite plated layer is arranged in the same direction as the IC chip; the IC chip is connected with the inner lead chemical nickel and porpezite plated layer through a bonding wire; and the IC chip, the ends of all the leads plated with the inner lead chemical plating nickel and palladium metal layers and the bonding wire are all packaged in a plastic package. The quad flat no lead package is manufactured through the following steps of: thinning and scribing a wafer; manufacturing a lead frame; loading the chip; performing pressure welding and plastic packaging; performing post-curing; printing; electroplating; separating the leads; separating a product; and testing/braiding. According to the package, the problems of few leads, long welding wire, high welding cost and limited frequency application during single-face packaging of the existing normal quad flat no lead package are solved.

14 Claims, 5 Drawing Sheets

(51) Int. Cl.
*H01L 21/48* (2006.01)
*H01L 23/31* (2006.01)
*H01L 23/00* (2006.01)

(52) U.S. Cl.
CPC .... *H01L23/49541* (2013.01); *H01L 23/49579* (2013.01); *H01L 24/03* (2013.01); *H01L 24/29* (2013.01); *H01L 24/45* (2013.01); *H01L 23/49582* (2013.01); *H01L 2224/0311* (2013.01); *H01L 2224/0381* (2013.01); *H01L 2224/03614* (2013.01); *H01L 2224/29155* (2013.01); *H01L 2224/32245* (2013.01); *H01L 2224/43847* (2013.01); *H01L 2224/4502* (2013.01); *H01L 2224/45147* (2013.01); *H01L 2224/48247* (2013.01); *H01L 2224/48257* (2013.01); *H01L 2224/73265* (2013.01)

(56) References Cited

FOREIGN PATENT DOCUMENTS

| | | |
|---|---|---|
| CN | 102184908 | 9/2011 |
| CN | 102354691 | 2/2012 |
| CN | 102629599 | 8/2012 |

* cited by examiner

QUAD FLAT NO LEAD PACKAGE AND PRODUCTION METHOD THEREOF

FIELD OF THE INVENTION

The present invention belongs to the field of electronic information automation component and part manufacturing technology, and relates to a quad flat no lead package. The present invention further relates to a production method of the package.

BACKGROUND OF THE INVENTION

In recent years, with the rapid development of convenient electronic components and parts in the field of mobile communication and mobile computer, small packaging and high-density assembly technologies have been considerably developed. Meanwhile, a series of rigor requirements are raised on the small packaging technology, for example, the packaging size is required as small as possible (particularly, the packaging height is smaller than smaller than 1 mm). The connection reliability after packaging shall be improved as much as possible so as to adapt to lead-free welding (protect the environment) and effectively reduce the cost.

For a long time, a single circle lead frame mode is always continued for QFN products due to the limitation of etching templates and etching process.

A QFN (Quad Flat No Lead Package) type multi-circle arranged and packaged integrated circuit packaging technology is a novel microminiature high density I/O packaging technology developed at home and abroad in recent years, and is one of the most advanced surface-mount and packaging technologies. It has the features of no lead, small area occupied by surface-mount and low installation height, and is a novel packaging technology which is rapidly developed for meeting the development demand of convenient electronic machines such as ultra-thin electronic products including PDA, 3G mobile phone, MP3, MP4, MP5, and the like, in the fields of mobile communication and mobile computer. However, the present quad flat no lead package has the defects of few leads (namely, few I/O), long welding wire, high welding wire cost, and limited frequency application, which cannot meet the demands of high density and multiple I/O packaging.

SUMMARY OF THE INVENTION

In order to overcome the foregoing problems in the prior art, the present invention aims at providing a quad flat no lead package which has multiple leads and short welding wires, and can meet the demands of high density and multiple I/O packaging.

Another objective of the present invention is to provide a production method of the foregoing package.

In order to realize the foregoing objectives, the present invention adopts a technical solution as follows. A quad flat no lead package comprises a lead frame carrier consisting of a carrier pit and three circles of leads arranged around the carrier pit, wherein the three circles of leads respectively consist of a plurality of leads that are disconnected mutually. An IC chip is adhered in the carrier pit; and an inner lead chemical nickel and porpezite plated layer is plated on all the leads. The inner lead chemical nickel and porpezite plated layer is arranged in the same direction as the IC chip. The IC chip is connected with the inner lead chemical nickel and porpezite plated layer through a bonding wire. The IC chip, the ends of all the leads plated with the inner lead chemical nickel and porpezite plated layers and the bonding wire are all packaged in a plastic package body.

The present invention adopts another technical solution as follows. A production method of the foregoing quad flat no lead package, specifically comprises the following steps.

Step 1: thin and scribe a wafer, and manufacture a lead frame.

Adopt an ordinary QFN thinning method to thin a wafer to obtain a wafer having a final thickness of 150 µm~200 µm, wherein a rough polishing range is from original wafer+ adhesive film to final thickness+adhesive film thickness+50 µm, a rough polishing speed is 3 µm/s~6 µm/s, a fine grinding thickness range is from final thickness+adhesive film thickness+50 µm to final wafer thickness+adhesive film thickness, and a fine grinding speed is 10 µm/min~20 µm/min. Adopt a breakage-proof process to perform scribing on the thinned wafer to obtain an IC chip, wherein a breakage-proof and anti-cracking scribing process software control technique is adopted, and a scribing feeding speed is ≤10 mm/s.

Manufacture a Lead Frame.

First step: take a copper plate having a thickness of 6 mil~8 mil, pretreat and coarsen the surface of the copper plate, to obtain a lead frame matrix.

Second step: evenly coat photosensitive ink on one surface of the lead frame matrix in a silk screening manner, bake for 10 minutes at a temperature of 75° C.~80° C. to harden the photosensitive ink. Use UV rays to irradiate a negative film, to form a figure on the surface of the lead frame matrix. Use a $Na_2CO_3$ corrosive liquid having a concentration of 0.8 g/L~1.2 g/L to treat the photosensitive ink irradiated by the UV rays, to form a discontinuous first photosensitive adhesive layer having a thickness of 10 µm~15 µm on the surface of the lead frame matrix.

Third step: chemically plate chemical nickel and porpezite on the surface region of the lead frame matrix not covered by the first photosensitive adhesive layer, to form an inner lead chemical nickel and porpezite plated layer having a thickness of 0.5 µm~5 µm.

Fourth step: use a sodium hydroxide corrosive liquid having a concentration of 3%~5% to remove the first photosensitive adhesive layer on the surface of the lead frame matrix, leave the inner lead chemical nickel and porpezite plated layer on the surface of the lead frame matrix, and wash.

Fifth step: plate photosensitive ink on the surface of the lead frame matrix having the inner lead chemical nickel and porpezite plated layer, to form a second photosensitive adhesive layer having a thickness of 10 µm~20 µm on the surface of the inner lead chemical nickel and porpezite plated layer, wherein the plating method and subsequent treatment method are the same as the second step.

Sixth step: use a ferric trichloride to perform half-corrosion on the surface of the lead frame matrix having the second photosensitive adhesive layer, wherein the region of the area not covered by the second photosensitive adhesive layer is corroded by the ferric trichloride etching liquid, and a corrosion depth is 0.06 mm+/−5 µm; form a carrier pit, a plurality of first inner leads, a plurality of second inner leads and a plurality of third inner leads in the surface, wherein the plurality of first inner leads form a first circle of inner leads; the plurality of second inner leads form a second circle of inner leads, and the plurality of third inner leads form a third circle of inner leads.

Seventh step: use a sodium hydroxide corrosive liquid to remove the second photosensitive adhesive layer, and wash, to obtain a lead frame.

Step 2: load the chip.

Adhere the IC chip on the bottom surface of the carrier pit. Cure after the chip is completely loaded, and adopt an ESPEC to bake for 3 h+0.5 h through a delamination resistance process, wherein a baking temperature is 175° C.+/−5° C.

Step 3: weld wire from the IC chip to each inner lead of the lead frame.

Step 4: select an environment friendly molding compound having a water absorbing capacity ≤0.35%, and an expansion coefficient a1≤1 to carry out plastic packaging and obtain a semifinished product, and adopt an ultra-thin packaging anti-warping process and a multiple-section molding anti-warping software control technique to carry out wire-deformation prevention and delamination resistance packaging during the plastic packaging process.

Step 5: use an oven which is filled with chlorine gas, ventilates smoothly, is flexible to control temperature, and has a temperature departure smaller than +/−3° C., to perform post-curing on the semifinished product after plastic packaging for 5 h, wherein a post-curing temperature is 150+/−3° C., and a QFN anti-warping curing fixture is adopted during the post-curing process.

Step 6: same with conventional QFN printing.

Step 7: carry out electroplating and lead separation.

Adopt a high precision high stability metal etching machine to spray the ferric trichloride corrosive liquid to the back side of the lead frame, carry out corrosive thinning on the back side of the lead frame, wherein a corrosive thinning thickness is 0.03 mm~0.04 mm, and a corrosive thinning precision is controlled +/−5 μm. Use two-stage deionized water to clean the corrosive liquid remained on the surface of the lead frame after corrosion. Use a dilute sulfuric acid corrosive liquid or a hydrochloric acid corrosive liquid to activate the surface of the lead frame, and remove oxide on the surface of the lead frame. Thoroughly clean corrosive liquid medicine and pickling liquid medicine on the surface of the lead frame through five-stage tap water. Dry via strong air and hot air. Electroplate a copper layer having a thickness of 8 μm~10 μm on the surface of the lead frame after corrosive thinning, then electroplate a pure tin layer having a thickness of 7 μm~15 μm on the surface of the electroplated copper layer, and finally use laser to cut from the back side of the lead frame, to realize lead separation.

Or, electroplate a pure tin layer having a thickness of 7 μm~15 μm on the back side of the lead frame firstly, then use a blade to cut the back side of the lead frame, wherein a cutting depth is 0.03 mm~0.04 mm, a cutting depth precision is controlled within +/−5 μm, and a cutting width is 0.2 mm~0.25 mm. Then use laser to ablate connected parts between the leads, to realize lead separation.

Or, electroplate a pure tin layer having a thickness of 7 μm~15 μm on the back side of the lead frame firstly, and use a water jet to cut the back side of the lead frame, to realize lead separation.

Step 8: separate a unit product from the frame.

Step 9: test/braid.

The conventional test of the packaging is same as the O/S and open short circuit tests of a traditional QFN product. Meanwhile, electrical property and thermal property tests are required so as to ensure the high yield rate and high reliability of the product, and prepare the quad flat no lead package.

According to the production method of the present invention, laser cutting is adopted to separate the leads so as to realize lead separation and prepare a package having multi-circle arranged lead frames. The package has more I/O number, smaller volume, lighter weight as well as excellent electrical property and thermal property, and is particularly suitable for any application having requirements on size, weight and property. According to the package, the problems of few pins, long bonding wire, high welding cost and limited frequency application during single-face packaging of the existing normal quad flat no lead package (QFN) are solved.

In the FIGS.: 1 refers to a lead frame carrier, 2 refers to a chip adhesive, 3 refers to an IC chip, 4 refers to a pad, 5 refers to a first inner lead, 6 refers to a second inner lead, 7 refers to a third inner lead, 8 refers to a first bonding wire, 9 refers to a second bonding wire, 10 refers to a third bonding wire, 11 refers to an inner lead chemical nickel and porpezite plated layer, 12 refers to a first pit, 13 refers to a second pit, 14 refers to a carrier pit, 15 refers to a plastic package body, 16 refers to a corrosive thinning layer, 17 refers to a first laser cutting channel, 18 refers to a second laser cutting channel, 19 refers to a first blade cutting channel, 20 refers to a second blade cutting channel, 21 refers to a first micro water jet laser cutting channel, 22 refers to a second micro water jet laser cutting channel, 23 refers to a first photosensitive adhesive layer, 24 refers to a second photosensitive adhesive layer, and 25 refers to a lead frame matrix.

DETAILED DESCRIPTION OF THE EMBODIMENTS

The present invention will be described hereinafter with reference to the drawings and detailed embodiments.

Figure 1:
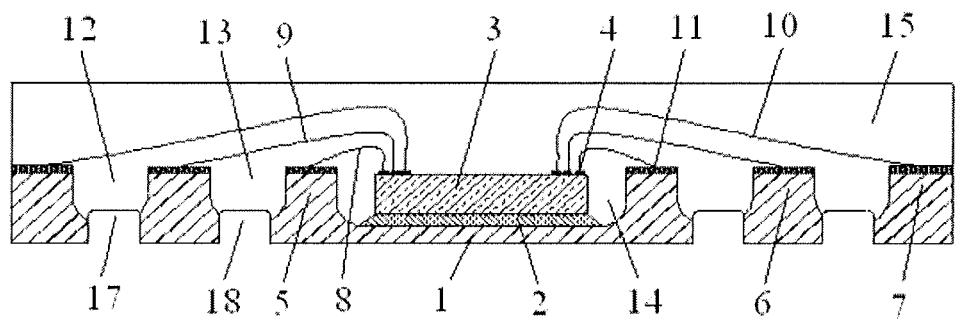
FIG. 1 is a structure view of a quad flat no lead package according to a first embodiment of the present invention.
Figure 2:
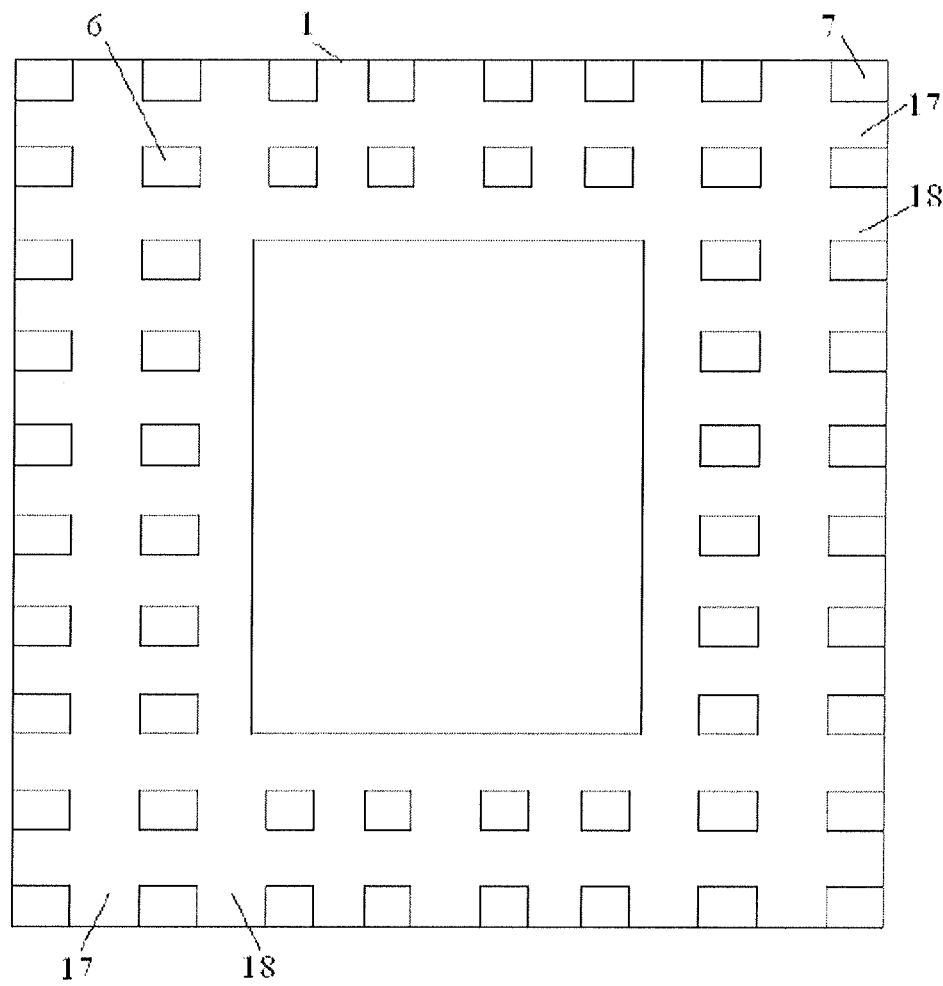
FIG. 2 is an upward view of FIG. 1.

As shown in FIG. 1 and FIG. 2, a structure of a quad flat no lead package according to a first embodiment of the present invention comprises a lead frame carrier 1. A carrier pit 14 is arranged on the lead frame carrier 1. Three circles of inner leads are arranged around the carrier pit 14. The three circles of inner leads are a first circle of inner leads, a second circle of inner leads and a third circle of inner leads in sequence from the inside to the outside. A second pit 13 is arranged between the first circle of inner leads and the second circle of inner leads. A first pit 12 is arranged between the second circle of inner leads and the third circle of inner leads. The first circle of inner leads consists of a plurality of first inner leads 5 that are disconnected mutually. The second circle of inner leads consists of a plurality of second inner leads 6 that are disconnected mutually. The third circle of inner leads consists of a plurality of third inner leads 7 that are disconnected mutually. An inner lead chemical nickel and porpezite plated layer 11 is arranged on all the inner leads. A first laser cutting channel 17 and a second laser cutting channel 18 are arranged on the back side of the lead frame carrier 1. The first laser cutting channel 17 is communicated with the first pit 12. The second laser cutting channel 18 is communicated with the second pit 13. An IC chip 3 is adhered on the bottom surface of the carrier pit 14. The IC chip 3 is adhered with the lead frame carrier 1 through a chip adhesive 2. A conductive adhesive or an insulating adhesive is adopted as the chip adhesive 2. A pad 4 is arranged on the IC chip 3. The pad 4 is connected with the first inner lead 5 through a first bonding wire 8, is connected with the second inner lead 6 through a second bonding wire 9, and is connected with the third inner lead 7 through a third bonding wire 10. A plastic package body is plastically packaged on the lead frame carrier 1. The carrier pit 14, the first bonding wire 8, the second bonding wire 9, the third bonding wire 10, the inner lead chemical nickel and porpezite plated layer 11 above each inner lead, the first inner lead 5, the second inner lead 6, the third inner lead 7 and the upper part of the side wall of the lead frame carrier 1 are all packaged in the plastic package body 15.

Figure 3:
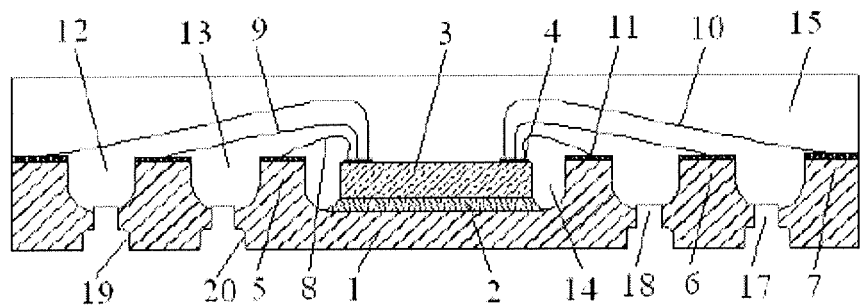
FIG. 3 is a structure view of a quad flat no lead package according to a second embodiment of the present invention.
Figure 4:
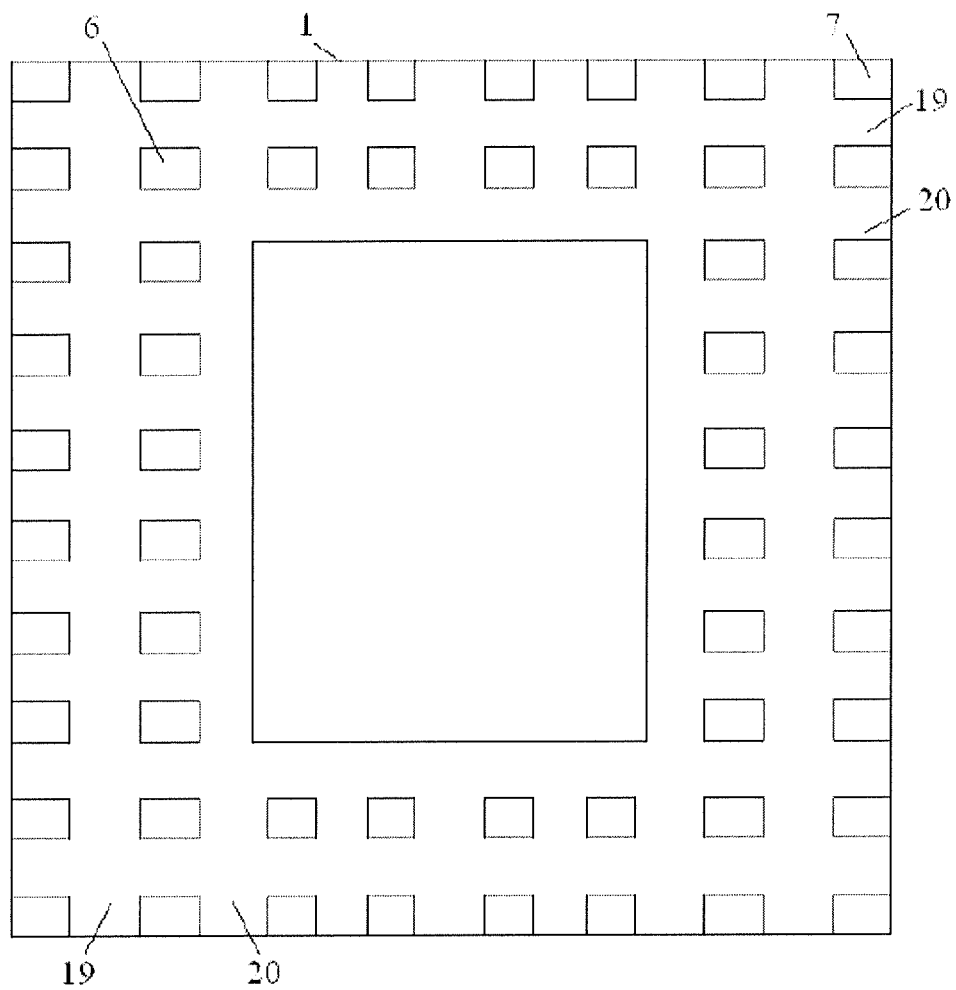
FIG. 4 is an upward view of FIG. 3.

FIG. 3 and FIG. 4 show a structure of a quad flat no lead package according to a second embodiment of the present invention, which is basically the same with the structure of the first embodiment as shown in FIG. 1 and FIG. 2, w herein the differences between the two structures are as follows. In the embodiment, a first blade cutting channel 19 communicated with the first laser cutting channel 17 is arranged below the first laser cutting channel 17, and a second blade cutting channel 20 communicated with the second laser cutting channel 18 is arranged below the second laser cutting channel 18.

Figure 5:
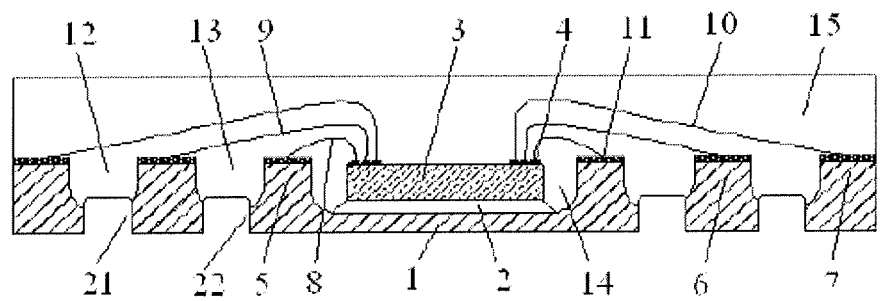
FIG. 5 is a structure view of a quad flat no lead package according to a third embodiment of the present invention.
Figure 6:
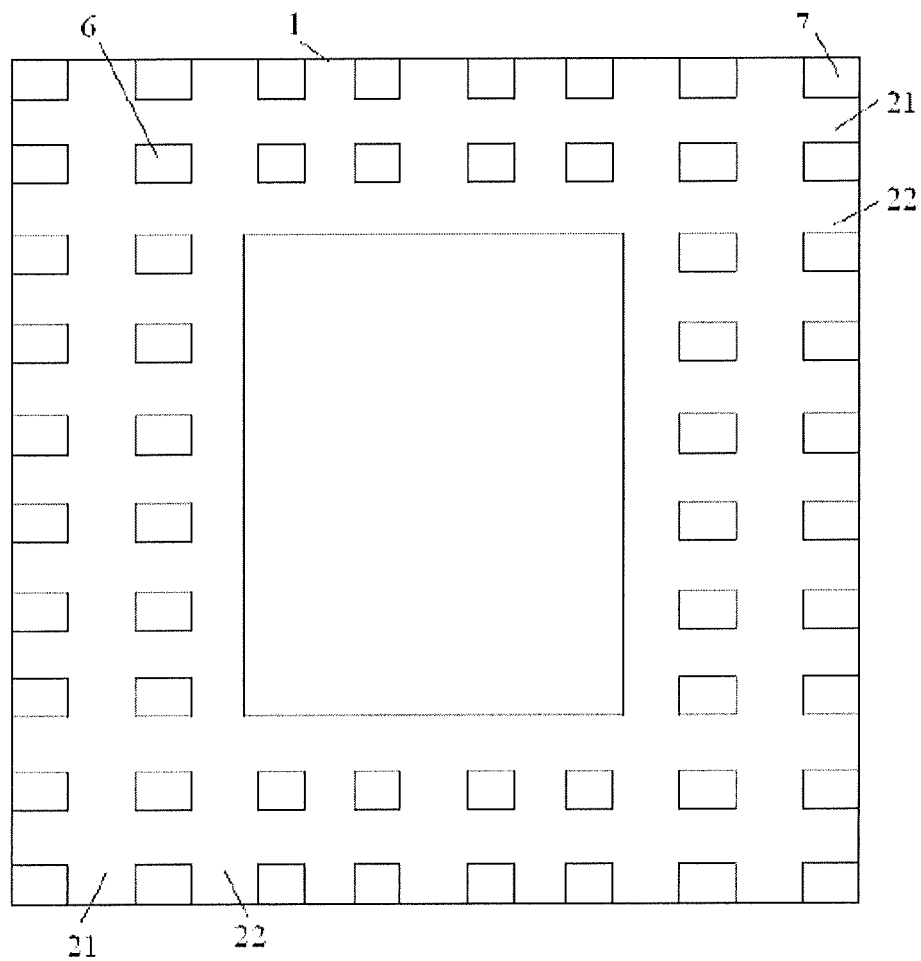
FIG. 6 is an upward view of FIG. 5.

A quad flat no lead package according to a third embodiment of the present invention is as shown in FIG. 5 and FIG. 6, wherein a structure of the quad flat no lead package is basically the same with the structure of the first embodiment, and the differences between the two structures are as follows. In the embodiment, the first laser cutting channel 17 is replaced by a first micro water jet laser cutting channel 21. The first micro water jet laser cutting channel is communicated with the first pit 12. The second laser cutting channel 18 is replaced by a second micro water jet laser cutting channel 22. The second micro water jet laser cutting channel 22 is communicated with the second pit 13.

The plastic package body 15 surrounds the upper surface and the side surface of the multi-circle lead frame carrier 1, the chip adhesive 2, the IC chip 3, the pad 4, the upper surface part and the side surface part of the inner leads as well as the pits on the upper surfaces of adjacent leads, thus forming an entire circuit. The IC chip 3, the pad 4, the chip adhesive 2 and the inner leads constitute a power supply and signal channel. The plastic package body 15 plays a role of protection and support on the IC chip 3, the pad 4, the inner leads and the bonding wires.

The present invention provides a process flow for producing each package above mentioned.

1) Package according to the first embodiment
Thinning and scribing a wafer, and manufacturing a lead frame carrier→loading the chip→pressure welding→plastic packaging→post-curing→printing→corrosive thinning→electroplating→separating the leads with laser→separating a product→inspecting the appearance→testing/braiding→packaging→warehousing.

2) Package according to the second embodiment
Thinning and scribing a wafer, and manufacturing a lead frame carrier→loading the chip pressure welding→plastic packaging→post-curing→printing→electroplating→blade cutting→separating the leads with laser→separating a product→inspecting the appearance testing/braiding packaging→warehousing.

3) Package according to the third embodiment
Thinning and scribing a wafer, and manufacturing a lead frame carrier→loading the chip→pressure welding→plastic packaging→post-curing→printing→electroplating→separating the leads with micro water jet laser→separating a product inspecting the appearance→testing/braiding→packaging→warehousing.

The present invention further provides a production method of the foregoing package, which specifically comprises the following steps.

Step 1: thin and scribe a wafer, and manufacture a lead frame.

Adopt an ordinary QFN thinning method to thin a wafer to obtain a wafer having a final thickness of 150 µm~200 µm, wherein a rough polishing range is from original wafer+adhesive film to final thickness+adhesive film thickness+50 µm, a rough polishing speed is 3 µm/s~6 µm/s, a fine grinding thickness range is from final thickness+adhesive film thickness+50 µm to final wafer thickness+adhesive film thickness, and a fine grinding speed is 10 µm/min~20 µm/min. Adopt a breakage-proof process to thin 6 inch to 8 inch wafers by using a VG-502MK II 8B full-automatic thinning machine and thin 8 inch to 12 inch wafers by using a PG300RM/TCN full-automatic thinning machine. Scribe the thinned wafer to obtain an IC chip 3. During the scribing process: a DISC 3350 scribing machine or a double blade scribing machine is adopted for wafers having a size no more than 8 inches, and an A-WD-300TXB scribing machine is adopted for wafers having a size between 8 inches and 12 inches, wherein a breakage-proof and anti-cracking scribing process software control technique is adopted, and a scribing feeding speed is ≤10 mm/s.

Manufacture a Lead Frame.

First step: take a copper plate having a thickness of 6 mil~8 mil, and pretreat the surface of the copper plate including degreasing, micro corrosion, pickling and washing, removing oil stain, fingerprints and oxides on the surface of the copper plate, and coarsening the surface of the copper plate, to obtain a lead frame matrix 25.

Figure 7:
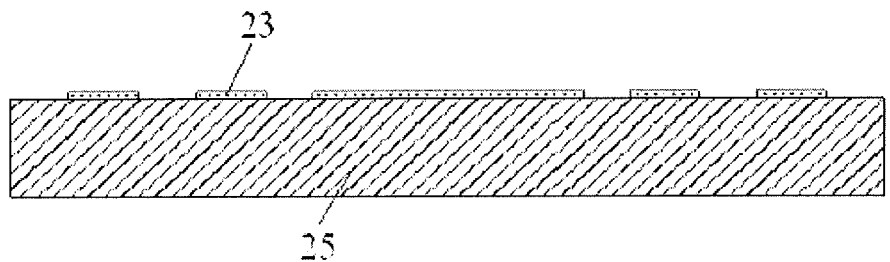
FIG. 7 is a sectional view of a frame having different windowing graphs through exposure and photographic developing after coating a first layer of photosensitive ink on the surface of a copper plate during a manufacturing process of a lead frame carrier of the package according to the present invention.

Second step: evenly coat photosensitive ink on one surface of the lead frame matrix 25 in a silk screening manner, bake for 10 minutes at a temperature of 75° C.~80° C., so that organic solvents in the photosensitive ink are volatilized, and the photosensitive ink is hardened and firmly adhered on the surface of the lead frame matrix 25. Use UV rays to irradiate a negative film, to cause photosensitive and non-photosensitive ink chemical polymerization difference between a photic region and a lighttight region, so as to form a graph on the surface of the lead frame matrix 25. Then use a $Na_2CO_3$ corrosive liquid having a concentration of 0.8 g/L~1.2 g/L to treat the photosensitive ink irradiated by the UV rays. Since the photosensitive ink is insoluble to weak base, the non-photosensitive ink is dissolved in the $Na_2CO_3$ corrosive liquid, thus remaining the photosensitive ink on the surface of the lead frame matrix 25, and forming a discontinuous first photosensitive adhesive layer 23 having a thickness of 10 μm~15 μm on the surface of the lead frame matrix 25, which is as shown in FIG. 7.

Figure 8:
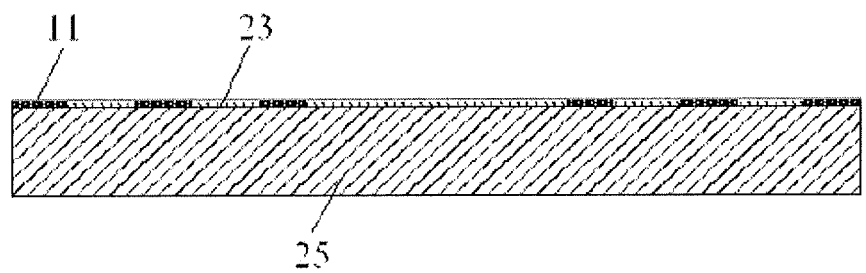
FIG. 8 is a sectional view of a surface region of the frame as shown in FIG. 7 not covered by the photosensitive ink and after being chemically plated with nickel and porpezite.

Third step: chemically plate chemical nickel and porpezite on the surface region of the lead frame matrix 25 not covered by the first photosensitive adhesive layer 23, to form an inner lead chemical nickel and porpezite plated layer 11 having a thickness of 0.5 μm~5 μm in the region, so as to improve the welding yield rate, which is as shown in FIG. 8.

Figure 9:
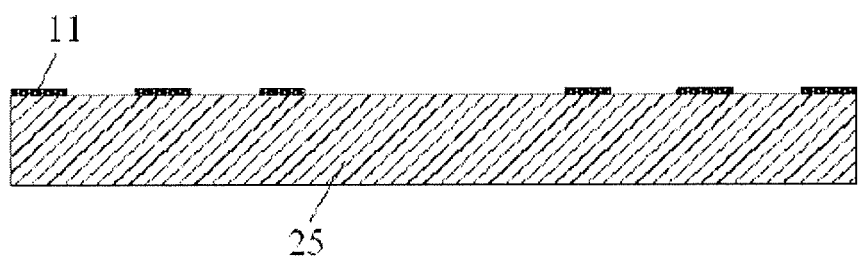
FIG. 9 is a sectional view of the frame after a first photosensitive adhesive layer is removed.

Fourth step: use a sodium hydroxide corrosive liquid having a concentration of 3%~5% to remove the first photosensitive adhesive layer 23 on the surface of the lead frame matrix 25, leave the inner lead chemical nickel and porpezite plated layer 11 on the surface of the lead frame matrix 11 which is as shown in FIG. 9, and then wash.

Figure 10:
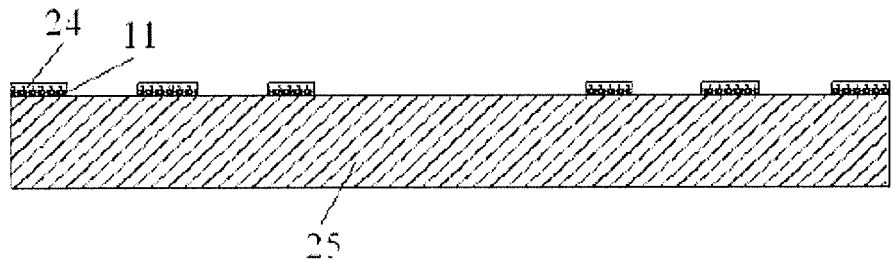
FIG. 10 is a sectional view of the frame coated by photosensitive ink again and covered by a second photosensitive adhesive layer through exposure and photographic developing on the surface of the chemically plated region.

Fifth step: plate photosensitive ink on the surface of the lead frame matrix 25 having the inner lead chemical nickel and porpezite plated layer 11, to form a second photosensitive adhesive layer 24 having a thickness of 10 μm~20 μm on the surface of the inner lead chemical nickel and porpezite plated layer 11 which is as shown in FIG. 10, wherein the plating method and subsequent treatment method are the same as the second step.

Figure 11:
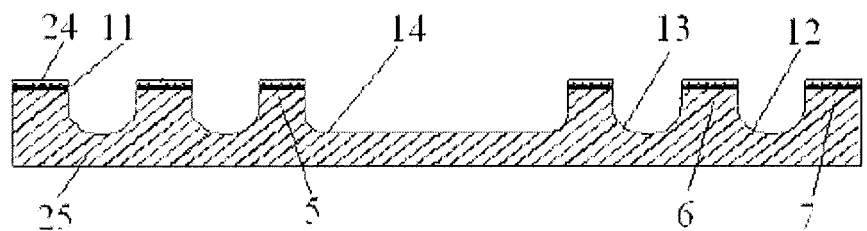
FIG. 11 is a sectional view of the frame after carrying out etching on a region not protected by the photosensitive adhesive.

Sixth step: use a ferric trichloride to perform half-corrosion on the surface of the lead frame matrix 25 having the second photosensitive adhesive layer 24, wherein the region of the area not covered by the second photosensitive adhesive layer 24 is corroded by the ferric trichloride etching liquid, and a corrosion depth is 0.06 mm+/−5 μm. Form a carrier pit 14, a plurality of first inner leads 5, a plurality of second inner leads 6 and a plurality of third inner leads 7 in the surface, wherein the plurality of first inner leads 5 form a first circle of inner leads; the plurality of second inner leads 6 form a second circle of inner leads, and the plurality of third inner leads 7 form a third circle of inner leads. A second pit 13 is arranged between the first circle of inner leads and the second circle of inner leads. A first pit 12 is arranged between the second circle of inner leads and the third circle of inner leads. The first circle of inner leads is arranged around the carrier pit 14, which is as shown in FIG. 11.

Figure 12:
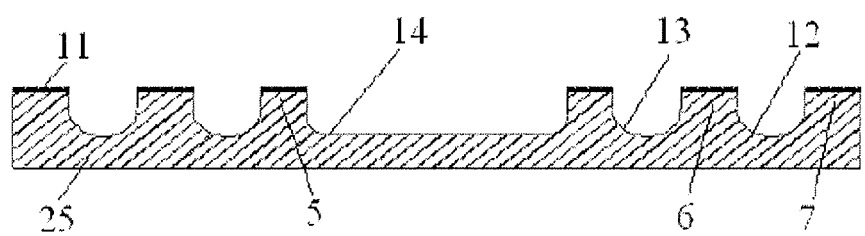
FIG. 12 is a sectional view of the frame after the second photosensitive adhesive layer is removed.

Seventh step: use a sodium hydroxide corrosive liquid to remove the second photosensitive adhesive layer 24, and then wash, to obtain a lead frame which is as shown in FIG. 12.

Step 2: load the chip.

Adopt an AD889 loading machine to adhere the IC chip 3 on the bottom surface of the carrier pit 14 through the chip adhesive 2. Conductive adhesive or insulating adhesive is adopted as the chip adhesive 2. Cure after the chip is completely loaded, and adopt an ESPEC to bake for 3 h+0.5 h through a delamination resistance process, wherein a baking temperature is 175° C.+/−5° C.

Step 3: pressure welding.

Adopt such devices as an ASM eagle60 wire welder or a W 3100 plus optima wire welder to weld the metal wire from each pad 4 on the IC chip 3 to each inner lead of the lead frame, and "M"-shaped arc, high and low arc or reverse manner is adopted for welding, to ensure no short circuit between the bonding wires. The pad 4 is connected with the first inner lead 5 through a first bonding wire 8, is connected with the second inner lead 6 through a second bonding wire 9, and is connected with the third inner lead 7 through a third bonding wire 10.

Step 4: plastic packaging

Figure 13:
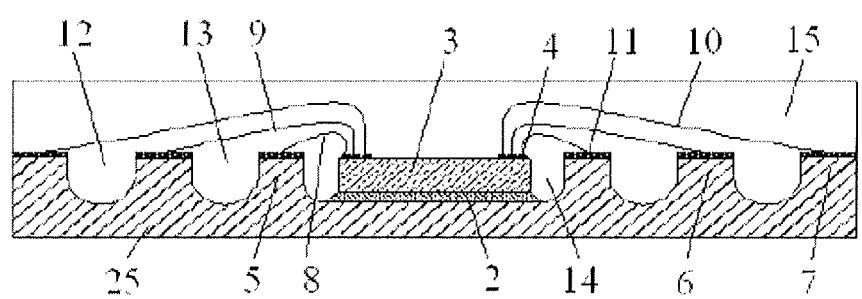
FIG. 13 is a sectional view of the frame after pressure welding and plastic packaging.

Select an environment friendly molding compound having low hygroscopicity (water absorbing capacity ≤0.35%), and low stress (an expansion coefficient a1≤1) to carry out plastic packaging and obtain a semifinished product, which is as shown in FIG. 13, and adopt an ultra-thin packaging anti-warping process and a multiple-section molding anti-warping software control technique to carry out wire-deformation prevention and delamination resistance packaging during the plastic packaging process, which solve the problems of wire-deformation, warping and delamination.

Step 5: post-curing

Use an oven which is filled with chlorine gas, ventilates smoothly, is flexible to control temperature, and has a temperature departure smaller than +/−3° C., to perform post-curing on the semifinished product after plastic packaging for 5 h, wherein a post-curing temperature is 150+/−3° C., and a QFN anti-warping curing fixture is adopted during the post-curing process.

Step 6: same with conventional QFN printing.

Step 7: carry out electroplating and lead separation.

Figure 14:
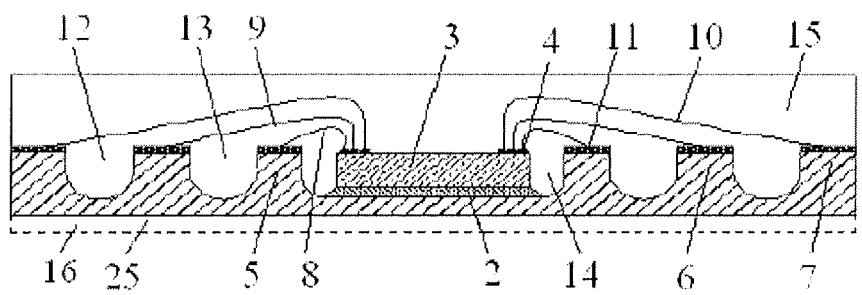
FIG. 14 is a schematic view for adopting a corrosion process to erode the back side of a lead frame carrier.

Adopt a high precision high stability metal etching machine to carry out corrosive thinning on the back side of the lead frame to corrode one corrosive thinning layer 16, which is as shown in FIG. 14, so as to reduce the thickness of the lead frame matrix 25, wherein the thickness of the corrosive thinning layer is 0.03 mm~0.04 mm, and a corrosive thinning precision is controlled within +/−5 μm. The thinning flow is as follows: feeding the plate—corrosion—two-stage washing—pickling—five-stage washing—drying—discharging the plate. A ferric trichloride corrosive liquid is adopted as a corrosive liquid medicine because the ferric trichloride corrosive liquid has a very high corrosion velocity and a high copper dissolution rate, and is easy to control, has low device investment, and meets the requirements of mass production. Moreover, the frame adopted is a copper alloy material, and ferric trichloride has a very good corrosion effect on alloy material. At the corrosion stage, in order to ensure the corrosion evenness on the surface of the board, the liquid medicine is sprayed to the back side of the frame in a spraying manner, wherein a spraying pressure is 3 bar~4 bar, and a lower spraying manner is adopted so as to reduce "pond effect". Use two-stage deionized water to clean the corrosive liquid remained on the surface of the lead frame after corrosion, wherein the pressure of the water is 2.0~4.0 kg/cm². The pickling mainly refers to using a dilute sulfuric acid corrosive liquid or a hydrochloric acid corrosive liquid to activate the surface of the lead frame, and removing oxide on the surface of the lead frame. Thoroughly clean corrosive liquid medicine and pickling liquid medicine on the surface of the lead frame through five-stage tap water, wherein the pressure of each stage of tap water is 2.0~4.0 kg/cm². Baking refers to drying through strong air firstly and then baking through hot air so as to achieve a baking effect. Electroplate a copper layer having a thickness of 8 μm~10 μm on the surface of the lead frame after corrosive thinning to form a transition copper layer on the back side of the lead frame so as to prepare for plating pure tin subsequently, then electroplate a pure tin layer having a thickness of 7 μm~15 μm on the surface of the electroplated copper layer to form the first laser cutting channel 17 communicated with the first pit 12 and the second laser cutting channel 18 communicated with the second pit 13, and finally cut off connected parts between the leads as well as connected parts between the leads and the carrier, to realize lead separation.

Or, electroplate a pure tin layer having a thickness of 7 μm~15 μm on the back side of the lead frame firstly, then use a blade to cut the back side of the lead frame, wherein a cutting depth is 0.03 mm~0.04 mm, a cutting depth precision is controlled within +/−5 μm, and a cutting width is 0.2 mm~0.25 mm, so as to decrease the laser cutting depth and cutting width, reduce the impacts of laser thermal diffusion and thermal burn, and improve the laser kerf quality, form a first blade cutting channel 19 corresponding to the first pit 12 and a second blade cutting channel 20 corresponding to the second pit 13, and then use laser to ablate the connected parts between the leads at the blade cutting section, to realize lead separation. The laser kerf width is a half of the blade cutting width. The laser kerf edge is required to be trim so as to meet the requirement on the product appearance quality.

Or, electroplate a pure tin layer having a thickness of 7 μm~15 μm on the back side of the lead frame firstly, and use a water jet to cut out a first micro water jet laser cutting channel 21 communicated with the first pit 12 and a second micro water jet laser cutting channel 22, communicated with the second pit 13 directly at the back side of the lead frame, and cut off the connected parts between the leads and the connected parts between the leads and the carrier, to realize lead separation.

Adopt a high precision solid ultraviolet laser cutting machine to cut off uncut dambars between the leads, so as to realize lead separation.

The lead frame in the package of the present invention is arranged in a no lead multi-circle manner, wherein a thinner copper plate is manufactured into a multi-circle QFN frame through such processes as gelatinizing, exposure, photographic developing, etching and the like. During the manufacturing process of the frame, a pit having a half thickness of the copper plate is corroded at the connected parts of the multiple-circle QFN leads, so that the carrier concaves down for a half depth as well. The frame has the feature that the carrier concaves down, which aims at reducing the radian and length of the bonding wire, effectively preventing wire deformation during plastic packaging, and saving the cost. In addition, the concaving down of the carrier can also effectively prevent the chip adhesive (conductive adhesive or insulating adhesive) from overflowing; moreover, the adhering area between the carrier and a molding compound is larger, and the reliability of the product will be greatly improved. The front side of the packaged frame after chip loading, pressure welding, plastic packaging, post-curing and electroplating is covered by the molding compound, the pit is filled in by the molding compound, and the back side of the frame is still copper. Afterwards, the back side of the frame is thinned through such auxiliary processes as corrosion and blade cutting, and then the uncut dambars of the leads are ablated by using laser from the back side of the frame, so as to realize lead separation.

Since the copper has favorable heat-conductive (heat diffusivity is 1.19 cm$^2$/s, and coefficient of thermal conductivity is 4.01 W/cm° C.) and electroconductive (electric conductivity is 6×10$^3$ s/m) characteristics, a heat affected zone may be generated at the two sides of the kerf during laser cutting, so that the copper of the heat affected zone at the edge of the kerf is easily oxidized and firmly adhered in the kerf in a cinder form. The cinder condition during laser cutting processing directly determines the quality of the kerf, while the cinder formation is depended on the heat volume generated and oxidation degree while cutting the copper plate largely. Tests show that: the main factor that affects the cinder is the thickness of the copper, the cutting speed, the laser power, the category of cinder eliminating gas and the gas pressure. Therefore, a proper cutting parameter may be set based on a mature laser cutting process, and nitrogen having good cinder eliminating effect may be selected as auxiliary gas. Meanwhile, the thickness of the frame is thinned, and the thermal diffusion of laser cutting is reduced, so as to reduce the cinder formed in the heat affected zone at the edge of the kerf due to oxidation, thus achieving the objective of improving the kerf quality. In addition, the copper belongs to a material that is difficulty machined among laser material micro machining because the copper has high heat reflectivity and low absorption rate to laser. It is very difficult to use ordinary CO2 laser and Nd:YAG laser to perform micro machining on the copper. However, the copper has higher absorption rate on the solid UV laser having shorter wavelength. Moreover, UV laser material machining process is a "light etching" effect, wherein high energy photons directly destroy the chemical welds of the materials, which is a "cold" treatment process, has a very the heat affected zone, and can greatly help in kerf quality improvement.

During the process of separating the leads through laser, as the frame material is thicker, a correspondingly higher laser power is required, and the laser power cannot be reduced instantaneously when ablating the uncut dambars between the leads through laser. While the melting temperature of the molding compound is lower than the melting temperature of the copper, which is very easy to ablate the molding compound, and thus damages the bonding wire in the molding compound. Therefore, thinning of the frame is also required, so as to decrease the cutting depth, reduce the laser ablation power, and prevent the molding compound from ablation. The cutting thermal diffusion is decreased, the cinder number is reduced and the kerf quality is improved as well when the laser ablation power is reduced. The present invention adopts two methods to thin the back side of the package. One method is to perform corrosive thinning on the back side of the package. The other method is to firstly carry out blade grooving on the uncut dambars of the leads of the package.

Except thinning the frame, another brand new laser cutting process—micro water jet laser cutting may be adopted to realize lead separation: import focused laser into a micro water column which is thinner than a hairline, so as to guide light beams to cut, and cool a workpiece, which eliminates the defect of oversize heat affected zone of conventional laser cutting, and greatly improves the laser cutting quality.

Step 8: separate a product.

Adopt a double blade cutting machine and a specialized fixture for cutting, and use a cutter knife to separate a unit product from the frame. A colloid cracking prevention technology is considered during the cutting and separation process.

According to the cutting separation in the method, the cutter knife is adopted and the colloid cracking prevention control technology is applied to produce, so as to prevent the hidden danger to crack the colloid during cutting and separation from design and production.

Step 9: test/braid.

The conventional test of the packaging is same as the O/S and open short circuit tests of a traditional QFN product. Meanwhile, electrical property and thermal property tests are required so as to ensure the high yield rate and high reliability of the product, and prepare the quad flat no lead package.

The present invention develops a high density packing technology for quad flat no lead multi-circle arranged lead frames and multi-circle arranged leads based on a relatively mature single-circle QFN integrated circuit packaging technology, and realizes separation of multi-circle arranged leads through laser cutting.

The production method of the present invention utilizes laser to realize lead separation. With respect to the problems that the laser cutting depth is difficult to control, and the size of the heat affected zone is in direct ratio to the cutting depth, a thinner frame is adopted, and corrosive thinning and blade cutting processes are added to properly thin the package firstly, so as to reduce the affect of thermal burn of laser. Meanwhile, the brand new laser cutting process—micro water jet water jet laser cutting is adopted, which is easy to control the cutting depth, can greatly reduce the thermal burn problem caused by laser cutting, and is easy to realize.

The quad flat no lead package of the present invention can meet the requirements of high I/O density, high reliability, miniaturization, thinness and low cost.

Embodiment 1

Adopt an ordinary QFN thinning method to thin a wafer to obtain a wafer having a final thickness of 150 μm~200 μm, wherein a rough polishing range is from original wafer+adhesive film to final thickness+adhesive film thickness+50 μm, a rough polishing speed is 3 μm/s~6 μm/s, a rough polishing speed is 3 μm/s, a fine grinding thickness range is from 155 μm+adhesive film thickness to 150 μm+adhesive film thickness, and a fine grinding speed is 10 μm/min. Adopt a breakage-proof process and adopt a DISC 3350 scribing machine to perform scribing on the thinned wafer to obtain an IC chip, wherein a breakage-proof and anti-cracking scribing process software control technique is adopted, and a scribing feeding speed is ≤10 mm/s.

Manufacture a Lead Frame Carrier.

First step: take a copper plate having a thickness of 6 mil, and pretreat the surface of the copper plate including degreasing, micro corrosion, pickling and washing, removing oil stain, fingerprints and oxides on the surface of the copper plate, and coarsening the surface of the copper plate, to obtain a lead frame matrix.

Second step: evenly coat photosensitive ink on one surface of the lead frame matrix in a silk screening manner, bake for 10 minutes at a temperature of 80° C., so that organic solvents in the photosensitive ink are volatized, and the photosensitive ink is hardened and firmly adhered on the surface of the lead frame matrix. Use UV rays to irradiate a negative film, to cause photosensitive and not photosensitive ink chemical polymerization difference between a photic region and a lighttight region, so as to form a graph on the surface of the lead frame matrix. Use a $Na_2CO_3$ corrosive liquid having a concentration of 0.8 g/L to treat the photosensitive ink irradiated by the UV rays, to form a discontinuous first photosensitive adhesive layer having a thickness of 10 μm on the surface of the lead frame matrix.

Third step: chemically plate chemical nickel and porpezite on the surface region of the lead frame matrix not covered by the first photosensitive adhesive layer, to form an inner lead chemical nickel and porpezite plated layer having a thickness of 5 μm.

Fourth step: use a sodium hydroxide corrosive liquid having a concentration of 3% to remove the first photosensitive adhesive layer on the surface of the lead frame matrix, leave the inner lead chemical nickel and porpezite plated layer on the surface of the lead frame matrix, and wash.

Fifth step: plate photosensitive ink on the surface of the lead frame matrix having the inner lead chemical nickel and porpezite plated layer, to form a second photosensitive adhesive layer having a thickness of 10 μm on the surface of the inner lead chemical nickel and porpezite plated layer, wherein the plating method and subsequent treatment method are the same as the second step.

Sixth step: use a ferric trichloride to perform half-corrosion on the surface of the lead frame matrix having the second photosensitive adhesive layer, wherein the region of the area not covered by the second photosensitive adhesive layer is corroded by the ferric trichloride etching liquid, and a corrosion depth is 0.06 mm; form a carrier pit, a plurality of first inner leads, a plurality of second inner leads and a plurality of third inner leads in the surface, wherein the plurality of first inner leads form a first circle of inner leads; the plurality of second inner leads form a second circle of inner leads, and the plurality of third inner leads form a third circle of inner leads. A second pit is arranged between the first circle of inner leads and the second circle of inner leads. A first pit is arranged between the second circle of inner leads and the third circle of inner leads. The first circle of inner leads are arranged around the carrier pit.

Seventh step: use a sodium hydroxide corrosive liquid to remove the second photosensitive adhesive layer, and then wash, to obtain a lead frame.

Adopt an AD889 loading machine to adhere the IC chip on the bottom surface of the carrier pit through the chip adhesive. Cure after the chip is completely loaded, and adopt an ESPEC to bake for 3 h through a delamination resistance process, wherein a baking temperature is 175° C. Adopt an ASM eagle60 wire welder to weld the metal wire from each pad on the IC chip to each inner lead of the lead frame, and "M"-shaped art is adopted to ensure no short circuit between the bonding wires. Select an environment friendly molding compound having a lower water absorbing capacity ≤0.35%, and an expansion coefficient a1≤1 to carry out plastic packaging and obtain a semifinished product, and adopt an ultra-thin packaging anti-warping process and a multiple-stage molding anti-warping software control technique to carry out wire-deformation prevention and delamination resistance packaging during the plastic packaging process, thus solving the problem of wire deformation, warping and delamination. Use an oven which is filled with chlorine gas, ventilates smoothly, is flexible to control temperature, and has a temperature departure smaller than +/−3° C., to perform post-curing on the semifinished product after plastic packaging for 5 h, wherein a post-curing temperature is 150° C., and a QFN anti-warping curing fixture is adopted during the post-curing process. Same with conventional QFN printing, adopt a high precision high stability metal etching machine to spray the ferric trichloride corrosive liquid to the back side of the lead frame in s lower spraying manner, wherein a spraying pressure is 3 bar; carry out corrosive thinning on the back side of the lead frame, wherein a corrosive thinning thickness is 0.03 mm, and a corrosive thinning precision is controlled within +/−5 μm. Use two-stage deionized water to clean the corrosive liquid remained on the surface of the lead frame after corrosion, wherein the pressure of the water is 2.0 kg/cm². Use a dilute sulfuric acid corrosive liquid to activate the surface of the lead frame, and remove oxide on the surface of the lead frame. Thoroughly clean corrosive liquid medicine and pickling liquid medicine on the surface of the lead frame through five-stage tap water having a pressure of 4.0 kg/cm². Dry via strong air and hot air. Electroplate a copper layer having a thickness of 8 μm on the surface of the lead frame after corrosive thinning to form a transition copper layer, then electroplate a pure tin layer having a thickness of 15 μm on the surface of the electroplated copper layer, and finally use a high precision solid ultraviolet laser cutting machine to cut from the back side of the lead frame, and then cut off the connected part between each lead and the connected parts between the leads and the carrier, so as to realize lead separation. Adopt a double blade cutting machine and a specialized fixture for cutting, and use a cutter knife to separate a unit product from the frame. A colloid cracking prevention technology is considered during the cutting and separation process. O/S and open short circuit tests same as that of a traditional QFN product are adopted. Meanwhile, electrical property and thermal property tests are carried out so as to ensure the high yield rate and high reliability of the product, and prepare the quad flat no lead package.

Embodiment 2

Adopt an ordinary QFN thinning method to thin a wafer to obtain a wafer having a final thickness of 200 μm, wherein a rough polishing range is from original wafer+adhesive film thickness to 250 μm+adhesive film thickness, a rough polishing speed is 6 μm/s, a fine grinding thickness range is from 250 μm+adhesive film thickness to 200 μm+adhesive film thickness, and a fine grinding speed is 20 μm/min. Adopt a breakage-proof process and adopt a double blade scribing machine to perform scribing on the thinned wafer to obtain an IC chip 3, wherein a breakage-proof and anti-cracking scribing process software control technique is adopted, and a scribing feeding speed is ≤10 mm/s.

Manufacture a Lead Frame.

First step: take a copper plate having a thickness of 8 mil, and pretreat the surface of the copper plate including degreasing, micro corrosion, pickling and washing, removing oil stain, fingerprints and oxides on the surface of the copper plate, and coarsening the surface of the copper plate, to obtain a lead frame matrix.

Second step: evenly coat photosensitive ink on one surface of the lead frame matrix in a silk screening manner, bake for 10 minutes at a temperature of 75° C., so that organic solvents in the photosensitive ink are volatized, and the photosensitive ink is hardened and firmly adhered on the surface of the lead frame matrix. Use UV rays to irradiate a negative film, to cause photosensitive and not photosensitive ink chemical polymerization difference between a photic region and a lighttight region, so as to form a graph on the surface of the lead frame matrix. Use a $Na_2CO_3$ corrosive liquid having a concentration of 1.2 g/L to treat the photosensitive ink irradiated by the UV rays, to form a discontinuous first photosensitive adhesive layer having a thickness of 15 μm on the surface of the lead frame matrix.

Third step: chemically plate chemical nickel and porpezite on the surface region of the lead frame matrix not covered by the first photosensitive adhesive layer, to form an inner lead chemical nickel and porpezite plated layer having a thickness of 3 μm.

Fourth step: use a sodium hydroxide corrosive liquid having a concentration of 5% to remove the first photosensitive adhesive layer on the surface of the lead frame matrix, leave the inner lead chemical nickel and porpezite plated layer on the surface of the lead frame matrix, and wash.

Fifth step: plate photosensitive ink on the surface of the lead frame matrix having the inner lead chemical nickel and porpezite plated layer, to form a second photosensitive adhesive layer having a thickness of 20 μm on the surface of the inner lead chemical nickel and porpezite plated layer, wherein the plating method and subsequent treatment method are the same as the second step.

Sixth step: use a ferric trichloride to perform half-corrosion on the surface of the lead frame matrix having the second photosensitive adhesive layer, wherein the region of the area not covered by the second photosensitive adhesive layer is corroded by the ferric trichloride etching liquid, and a corrosion depth is 0.065 mm; form a carrier pit, a plurality of first inner leads, a plurality of second inner leads and a plurality of third inner leads in the surface, wherein the plurality of first inner leads form a first circle of inner leads; the plurality of second inner leads form a second circle of inner leads, and the plurality of third inner leads form a third circle of inner leads.

Seventh step: use a sodium hydroxide corrosive liquid to remove the second photosensitive adhesive layer, and then wash, to obtain a lead frame.

Adopt an AD829 loading machine to adhere the IC chip on the bottom surface of the carrier pit through an insulating adhesive. Cure after the chip is completely loaded, and adopt an ESPEC to bake for 3.5 h through a delamination resistance process, wherein a baking temperature is 180° C. Adopt a W 3100 plus optima wire welder to weld the copper wire from each pad on the IC chip to each inner lead of the lead frame, and high and low arc is adopted for welding, to ensure no short circuit between the bonding wires. Select an environment friendly molding compound having a water absorbing capacity ≤0.35%, and an expansion coefficient a1≤1 to carry out plastic packaging and obtain a semifinished product, and adopt an ultra-thin packaging anti-warping process and a multiple-stage molding anti-warping software control technique to carry out wire-deformation prevention and delamination resistance packaging during the plastic packaging process, thus solving the problem of wire deformation, warping and delamination. Use an oven which is filled with chlorine gas, ventilates smoothly, is flexible to control temperature, and has a temperature departure smaller than +/−3° C., to perform post-curing on the semifinished product after plastic packaging for 5 h, wherein a post-curing temperature is 153° C., and a QFN anti-warping curing fixture is adopted during the post-curing process. Same with conventional QFN printing, adopt a high precision high stability metal etching machine to spray the ferric trichloride corrosive liquid to the back side of the lead frame in s lower spraying manner, wherein a spraying pressure is 4 bar; carry out corrosive thinning on the back side of the lead frame, wherein a corrosive thinning thickness is 0.04 mm, and a corrosive thinning precision is controlled within +/−5 μm. Use two-stage deionized water to clean the corrosive liquid remained on the surface of the lead frame after corrosion, wherein the pressure of the water is 4.0 kg/cm$^2$. Use a hydrochloric acid corrosive liquid to activate the surface of the lead frame, and remove oxide on the surface of the lead frame. Thoroughly clean corrosive liquid medicine and pickling liquid medicine on the surface of the lead frame through five-stage tap water having a pressure of 2.0 kg/cm$^2$. Dry via strong air and hot air. Electroplate a copper layer having a thickness of 10 μm on the surface of the lead frame after corrosive thinning to form a transition copper layer, then electroplate a pure tin layer having a thickness of 7 μm on the surface of the electroplated copper layer, and finally use a high precision solid ultraviolet laser cutting machine to cut from the back side of the lead frame, and then cut off the connected part between each lead and the connected parts between the leads and the carrier, so as to realize lead separation. Adopt a double blade cutting machine and a specialized fixture for cutting, and use a cutter knife to separate a unit product from the frame. A colloid cracking prevention technology is considered during the cutting and separation process. O/S and open short circuit tests same as that of a traditional QFN product are adopted. Meanwhile, electrical property and thermal property tests are carried out so as to ensure the high yield rate and high reliability of the product, and prepare the quad flat no lead package.

Embodiment 3

Adopt an ordinary QFN thinning method to thin a wafer to obtain a wafer having a final thickness of 175 µm, wherein a rough polishing range is from original wafer+adhesive film thickness to 225 µm+adhesive film thickness, a rough polishing speed is 4.5 m/s, a fine grinding thickness range is from 225 µm+adhesive film thickness to 175 µm+adhesive film thickness, and a fine grinding speed is 15 µm/min. Adopt a breakage-proof process and adopt an A-WD-300TXB scribing machine to perform scribing on the thinned wafer to obtain an IC chip 3, wherein a breakage-proof and anti-cracking scribing process software control technique is adopted, and a scribing feeding speed is ≤10 mm/s.

Manufacture a Lead Frame.

First step: take a copper plate having a thickness of 7 mil, and pretreat the surface of the copper plate including degreasing, micro corrosion, pickling and washing, removing oil stain, fingerprints and oxides on the surface of the copper plate, and coarsening the surface of the copper plate, to obtain a lead frame matrix.

Second step: evenly coat photosensitive ink on one surface of the lead frame matrix in a silk screening manner, bake for 10 minutes at a temperature of 77.5° C., so that organic solvents in the photosensitive ink are volatized, and the photosensitive ink is hardened and firmly adhered on the surface of the lead frame matrix. Use UV rays to irradiate a negative film, to cause photosensitive and not photosensitive ink chemical polymerization difference between a photic region and a lighttight region, so as to form a graph on the surface of the lead frame matrix. Use a $Na_2CO_3$ corrosive liquid having a concentration of 1.0 g/L to treat the photosensitive ink irradiated by the UV rays, to form a discontinuous first photosensitive adhesive layer having a thickness of 12.5 µm on the surface of the lead frame matrix.

Third step: chemically plate chemical nickel and porpezite on the surface region of the lead frame matrix not covered by the first photosensitive adhesive layer, to form an inner lead chemical nickel and porpezite plated layer having a thickness of 0.5 µm.

Fourth step: use a sodium hydroxide corrosive liquid having a concentration of 4% to remove the first photosensitive adhesive layer on the surface of the lead frame matrix, leave the inner lead chemical nickel and porpezite plated layer on the surface of the lead frame matrix, and then wash.

Fifth step: plate photosensitive ink on the surface of the lead frame matrix having the inner lead chemical nickel and porpezite plated layer, to form a second photosensitive adhesive layer having a thickness of 15 µm on the surface of the inner lead chemical nickel and porpezite plated layer, wherein the plating method and subsequent treatment method are the same as the second step.

Sixth step: use a ferric trichloride to perform half-corrosion on the surface of the lead frame matrix having the second photosensitive adhesive layer, wherein the region of the area not covered by the second photosensitive adhesive layer is corroded by the ferric trichloride etching liquid, and a corrosion depth is 0.055 mm; form a carrier pit, a plurality of first inner leads, a plurality of second inner leads and a plurality of third inner leads in the surface, wherein the plurality of first inner leads form a first circle of inner leads; the plurality of second inner leads form a second circle of inner leads, and the plurality of third inner leads form a third circle of inner leads.

Seventh step: use a sodium hydroxide corrosive liquid to remove the second photosensitive adhesive layer, and wash, to obtain a lead frame. Adopt an AD889 loading machine to adhere the IC chip on the bottom surface of the carrier pit through the chip adhesive. Cure after the chip is completely loaded, and adopt an ESPEC to bake for 3.3 h through a delamination resistance process, wherein a baking temperature is 170° C. Adopt an ASM eagle60 wire welder to weld the metal wire from each pad on the IC chip to each inner lead of the lead frame, and a reverse manner is adopted for welding, to ensure no short circuit between the bonding wires. Select an environment friendly molding compound having a water absorbing capacity ≤0.35%, and an expansion coefficient a1≤1 to carry out plastic packaging and obtain a semifinished product, and adopt an ultra-thin packaging anti-warping process and a multiple-stage molding anti-warping software control technique to carry out wire-deformation prevention and delamination resistance packaging during the plastic packaging process, thus solving the problem of wire deformation, warping and delamination. Use an oven which is filled with chlorine gas, ventilates smoothly, is flexible to control temperature, and has a temperature departure smaller than +/−3° C., to perform post-curing on the semifinished product after plastic packaging for 5 h, wherein a post-curing temperature is 147° C., and a QFN anti-warping curing fixture is adopted during the post-curing process. Same with conventional QFN printing, adopt a high precision high stability metal etching machine to spray the ferric trichloride corrosive liquid to the back side of the lead frame, wherein a spraying pressure is 3.5 bar; carry out corrosive thinning on the back side of the lead frame, wherein a corrosive thinning thickness is 0.035 mm, and a corrosive thinning precision is controlled within +/−5 µm. Use two-stage deionized water to clean the corrosive liquid remained on the surface of the lead frame after corrosion, wherein the pressure of the water is 3.0 kg/cm². Use a dilute sulfuric acid corrosive liquid to activate the surface of the lead frame, and remove oxide on the surface of the lead frame. Thoroughly clean corrosive liquid medicine and pickling liquid medicine on the surface of the lead frame through five-stage tap water having a pressure of 3.0 kg/cm². Dry via strong air and hot air. Electroplate a copper layer having a thickness of 9 µm on the surface of the lead frame after corrosive thinning to form a transition copper layer, then electroplate a pure tin layer having a thickness of 11 µm on the surface of the electroplated copper layer, and finally use a high precision solid ultraviolet laser cutting machine to cut from the back side of the lead frame, and then cut off the connected part between each lead and the connected parts between the leads and the carrier, so as to realize lead separation. Adopt a double blade cutting machine and a specialized fixture for cutting, and use a cutter knife to separate a unit product from the frame. A colloid cracking prevention technology is considered during the cutting and separation process. O/S and open short circuit tests same as that of a traditional QFN product are adopted. Meanwhile, electrical property and thermal property tests are carried out so as to ensure the high yield rate and high reliability of the product, and prepare the quad flat no lead package.

Embodiment 4

Thin and scribe a wafer, manufacture a lead frame, load the chip, and perform pressure welding, plastic packaging, post-curing and printing according to the method of embodiment 1. Then electroplate a pure tin layer having a thickness of 7 µm on the back side of the lead frame, use a blade to cut the back side of the lead frame, wherein a cutting depth is 0.03 mm, a cutting depth precision is controlled within +/−5 μm, and a cutting width is 0.2 mm; and then use a high precision solid ultraviolet laser cutting machine to ablate connected parts between the leads at the blade cutting section, so as to realize lead separation. The laser kerf width is a half of the blade cutting width. Then prepare the quad flat no lead package according to the method of embodiment 1.

Embodiment 5

Thin and scribe a wafer, manufacture a lead frame, load the chip, and perform pressure welding, plastic packaging, post-curing and printing according to the method of embodiment 2. Then electroplate a pure tin layer having a thickness of 15 μm on the back side of the lead frame firstly, use a blade to cut the back side of the lead frame, wherein a cutting depth is 0.04 mm, a cutting depth precision is controlled within +/−5 μm, and a cutting width is 0.25 mm. Then use a high precision solid ultraviolet laser cutting machine to ablate connected parts between the leads at the blade cutting section, so as to realize lead separation. The laser kerf width is a half of the blade cutting width. Then prepare the quad flat no lead package according to the method of embodiment 2.

Embodiment 6

Thin and scribe a wafer, manufacture a lead frame, load the chip, and perform pressure welding, plastic packaging, post-curing and printing according to the method of embodiment 3. Then electroplate a pure tin layer having a thickness of 11 μm on the back side of the lead frame firstly, use a blade to cut the back side of the lead frame, wherein a cutting depth is 0.035 mm, a cutting depth precision is controlled within +/−5 μm, and a cutting width is 0.225 mm. Then use a high precision solid ultraviolet laser cutting machine to ablate connected parts between the leads at the blade cutting section, so as to realize lead separation. The laser kerf width is a half of the blade cutting width. Then prepare the quad flat no lead package according to the method of embodiment 3.

Embodiment 7

Thin and scribe a wafer, manufacture a lead frame, load the chip, and perform pressure welding, plastic packaging, post-curing and printing according to the method of embodiment 3. Electroplate a copper layer having a thickness of 15 μm on the surface of the lead frame after corrosive thinning, use a water jet to cut the back side of the lead frame, to cut off the connected part between each lead and the connected parts between the leads and the carrier, so as to realize lead separation. Then prepare the quad flat no lead package according to the method of embodiment 3.

Embodiment 8

Thin and scribe a wafer, manufacture a lead frame, load the chip, and perform pressure welding, plastic packaging, post-curing and printing according to the method of embodiment 2. Electroplate a copper layer having a thickness of 11 μm on the surface of the lead frame after corrosive thinning, use a water jet to cut the back side of the lead frame, to cut off the connected part between each lead and the connected parts between the leads and the carrier, so as to realize lead separation. Then prepare the quad flat no lead package according to the method of embodiment 2.

Embodiment 9

Thin and scribe a wafer, manufacture a lead frame, load the chip, and perform pressure welding, plastic packaging, post-curing and printing according to the method of embodiment 1, Electroplate a copper layer having a thickness of 7 μm on the surface of the lead frame after corrosive thinning, use a water jet to cut the back side of the lead frame, to cut off the connected part between each lead and the connected parts between the leads and the carrier, so as to realize lead separation. Then prepare the quad flat no lead package according to the method of embodiment 1.

What is claimed is:

1. A quad flat no lead package, comprising:
   a lead frame, wherein
      the lead frame includes a carrier pit and a plurality of leads arranged around the carrier pit;
      the plurality of leads are electrically insulated from each other;
      an IC chip being adhered in the carrier pit;
      a nickel-palladium metal layer is formed on a first surface of each of the leads;
      the IC chip is electrically connected to the nickel-palladium metal layer of the leads through a bonding wire; and
      the IC chip, the first surfaces of the leads, and the bonding wire are disposed in a plastic package body.

2. A method for producing a quad flat no lead package, the method comprising:
   coating a first surface of a lead frame so as to form first regions with a first adhesive layer and second regions without a first adhesive layer on the first surface;
   plating the second regions of the first surface so as to form a nickel-palladium metal layer;
   removing the first adhesive layer of the first regions;
   coating each surface of the nickel-palladium metal layer so as to form a second adhesive layer;
   forming a carrier pit and peripheral pits by etching the first regions;
   removing the second adhesive layer of the second regions;
   mounting an IC chip in the carrier pit;
   bonding a bonding wire to a pad on the IC chip and the nickel-palladium metal layer;
   disposing the IC chip, the first surface of the lead frame, and wires in a plastic package body;
   spraying a corrosive liquid to a second surface of the lead frame, the second surface being opposite to the first surface; and
   cutting the lead frame from the second surface of the lead frame.

3. The production method according to claim 2, wherein in the bonding step, the bonding wire is bonded to the pad on the IC chip and the nickel-palladium metal layer by an ASM eagle60 wire bonder or a W 3100 plus optima wire bonder.

4. The production method according to claim 2, wherein in the bonding step, a plurality of bonding wires are present, and the plurality of bonding wires are formed in an M]-shaped arc or a reverse M-shaped arc to avoid short circuit between the bonding wires.

5. The production method according to claim 2, wherein in the spraying step, a spraying pressure is in a range of 3 bar to 4 bar.

6. The production method according to claim 2, wherein in the separating step, the leads are separated by a high precision solid ultraviolet laser cutting machine.

7. The production method according to claim 2, wherein in the mounting step, the IC chip is bonded to the carrier pit of the lead frame by an AD889 loading machine or an AD829 loading machine.

8. The quad flat no lead package according to claim 1, wherein the nickel-palladium metal layer comprises a porpezite.

9. The quad flat no lead package according to claim 1, wherein the plurality of leads are electrically insulated from each other by the plastic package body and channels formed on the second surface of the lead frame, the channels being disposed in longitudinal and horizontal directions.

10. The quad flat no lead package according to claim 9, wherein the channels are formed by one of laser cutting, blade cutting, or micro water jet cutting.

11. The production method according to claim 2, wherein in the cutting step, the lead frame is cut by one of a laser, a blade, or a micro water jet.

12. The production method according to claim 2, wherein in the cutting step, the lead frame is cut by a blade.

13. The production method according to claim 2, wherein in the cutting step, the lead frame is cut by micro water jet.

14. The quad flat no lead package according to claim 1, wherein the lead frame includes three circles of the leads arranged around the carrier pit.

\* \* \* \* \*